United States Patent
Sekino

(10) Patent No.: US 8,183,878 B2
(45) Date of Patent: May 22, 2012

(54) ELECTRICAL TESTING DEVICE AND ELECTRICAL TESTING METHOD WITH CONTROL OF PROBE CONTACT PRESSURE

(75) Inventor: Kentarou Sekino, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 233 days.

(21) Appl. No.: 12/692,224

(22) Filed: Jan. 22, 2010

(65) Prior Publication Data

US 2010/0182029 A1    Jul. 22, 2010

(30) Foreign Application Priority Data

Jan. 22, 2009   (JP) .................................. 2009-012108

(51) Int. Cl.
    *G01R 31/20* (2006.01)
(52) U.S. Cl. .......... 324/754.15; 324/754.11; 324/754.16
(58) Field of Classification Search .......................... None
    See application file for complete search history.

(56) References Cited

U.S. PATENT DOCUMENTS

| 5,077,522 | A | * | 12/1991 | Lahitte et al. | 324/754.15 |
| 5,762,504 | A | * | 6/1998 | Itoh | 439/66 |
| 6,369,598 | B2 | * | 4/2002 | Porter et al. | 324/750.25 |
| 6,900,652 | B2 | * | 5/2005 | Mazur | 324/754.16 |

FOREIGN PATENT DOCUMENTS

| JP | 2-234079 | 9/1990 |
| JP | 2005-241427 | 9/2005 |

* cited by examiner

*Primary Examiner* — Minh N Tang
(74) *Attorney, Agent, or Firm* — Young & Thompson

(57) ABSTRACT

An electrical testing device has a first probe that electrically contacts with an inspection device, a second probe that is electrically connected to the first probe and electrically contacts with an external terminal of a test object, a cylinder that houses the first probe and second probe, and into which and out of which a fluid flows between the first probe and second probe, and a fluid pressure regulator that controls the fluid pressure in the cylinder. The fluid pressure in the cylinder controls the contact force between the first probe and the inspection device and the contact force between the second probe and the external terminal.

8 Claims, 3 Drawing Sheets

US 8,183,878 B2

ELECTRICAL TESTING DEVICE AND ELECTRICAL TESTING METHOD WITH CONTROL OF PROBE CONTACT PRESSURE

TECHNICAL FIELD

Reference to Related Application

This application is based upon and claims the benefit of the priority of Japanese patent application No. 2009-012108, filed on Jan. 22, 2009, the disclosure of which is incorporated herein in its entirety by reference thereto.

The present invention relates to a device that is used in electrical testing of an electronic device (for example, a semiconductor device), and to an electrical testing method for an electronic device.

BACKGROUND

In the process of manufacturing an electronic device such as a semiconductor device, an electrical testing device is used to inspect the electrical characteristics of the electronic device, and to sort out defective and good parts. In this electrical testing, a probe of the electrical testing device is electrically connected to an external terminal of the electronic device, or to an external terminal of the electronic device and inspection device (for example a test board). The technology for connecting the probe and external terminal is as disclosed, for example, in patent document 1 and patent document 2.

The inspection jig that is disclosed in patent document 1 is an inspection jig for a semiconductor device that connects a plurality of external terminals of a semiconductor device to a test board via a plurality of contacts, where in the inspection jig disclosed in patent document 1, the contacts are arranged inside a case such that they are independently movable, and a vacuum suction path is provided inside each of the contacts such that when the contacts are in contact with the external terminals, the contacts and external terminals are adhered together by suction.

An IC socket that is disclosed in patent document 2 comprises: a plurality of plungers, a plunger installation unit and a base member. The plungers have a contact section on the top end, connection section on the bottom end, and a piston section in the middle. The plunger installation unit comprises cylinder holes formed such that the piston section fits in the plunger movably up and down, causing the contact section to protrude out from the top surface, the installation unit further comprising an air path that allows pressurized air to flow into the cylinder hole from the lower side of the piston section. The base member is provided with barrel members at predetermined locations for receiving an electrically conductive fluid in which the connection sections of the plungers are immersed, the base member being layered with the bottom surface of the plunger installation unit. In the IC socket disclosed in patent document 2, the contact sections are brought into contact with the lead pins of the IC by letting pressurized air into the cylinder holes causing the piston sections to force the plungers upward.

[Patent Document 1]

Japanese Patent Kokai Publication No. JP-P2005-241427A

[Patent Document 2]

Japanese Patent Kokai Publication No. JP-A-02-234079

SUMMARY

The entire disclosures of Patent Documents 1 and 2 are incorporated herein by reference thereto.

The following analysis is given from the aspects of the present invention.

When performing an electrical test of electronic devices, the position of the external terminals of each electronic device may vary, for example, due to warping that may occur in the BGA (Ball Grid Array) package, or variation in the placement position of external terminals of a QFP (Quad Flat Package). In that case, variations will occur in the contact force at which probes of the electrical testing device come in contact with the external terminals. As a result, there arise electronic devices determined as failure by the electrical test, causing a decrease in yield.

For example, when a probe is pressed against an external terminal by a repulsive force of a coil spring, the contact force between the external terminal and the probe will become different due to warping of the package or variation of the placement position of the external terminals. In addition, there are also variations in the repulsive force (pressure force) of the coil spring itself, so at locations where there is a weak contact force between the probe and the external terminal, the contact resistance becomes high, and the result of the electrical test becomes failure.

On the other hand, when the load applied to the electronic device is increased, or suction mounting is employed as in disclosed in Patent document 1 in order to increase the contact force between the probe and the external terminal, problems then occur such as deformation or damage to the external terminal, and this also results in a decrease in yield.

In the IC socket disclosed in Patent document 2, there is no detection mechanism or feedback mechanism for the pressure of the pressurized gas, so there is a possibility that there will be improper contact between the contact section (probes) and the lead pins (external terminals), causing deformation or damage of the external terminal, or poor contact to occur. Moreover, in the IC socket disclosed in Patent document 2, the IC is electrically connected to the IC testing device by way of a base board, so the construction thereof can not but become large and complicated. Furthermore, in the base board, in order to electrically connect the lead pins and the IC testing device, an electrically conductive fluid (mercury or the like) is used, and together with requiring labor to maintain and manage that fluid, sufficient consideration must also be taken from the aspect of safety and the environment.

In a first aspect of the present invention, there is provided an electrical testing device. The testing device comprises: a first probe that comes in electrical contact with an inspection device; a second probe that is electrically connected to the first probe, and comes in electrical contact with an external terminal of a test object. The testing device further comprises a cylinder which houses the first probe and the second probe, and into or out of which fluid flows between the first probe and the second probe. A fluid pressure regulator controls the fluid pressure in the cylinder. The contact force between the first probe and the inspection device, and the contact force between the second probe and the external terminal are controlled by the fluid pressure in the cylinder.

In a preferred mode of the first aspect, the first probe and the second probe are connected by an elastic member. The elastic member presses the first probe toward the inspection device, and presses the second probe toward the external terminal.

In a preferred mode of the first aspect, of the contact force of the first probe against the inspection device, and the contact force of the second probe against the external terminal, the contact force due to fluid pressure in the cylinder is larger than the contact force due to the pressing force of the elastic member.

In a preferred mode of the first aspect, the contact force due to the pressing force of the elastic member is 5% or less of the contact force due to the fluid pressure.

In a preferred mode of the first aspect, the first probe and the second probe are electrically connected by way of the elastic member.

In a preferred mode of the first aspect, the elastic member is a coil spring.

In a preferred mode of the first aspect, the fluid is air, and the fluid pressure regulator is an electrical fluid regulator.

In a second aspect of the present invention, there is provided an electrical testing method for an electronic device. The method comprises supplying fluid into a cylinder that houses a first probe and second probe that are electrically connected, maintaining electrical contact between the first probe and inspection device, and maintaining electrical contact between the second probe and an external terminal of the electronic device by the fluid pressure in the cylinder. The fluid pressure in a plurality of cylinders is controlled such that the fluid pressure is constant.

In a preferred mode of the second aspect, the first probe and the second probe are connected by an elastic member. The pressing force of the elastic member maintains the electrical contact between the first probe and the inspection device, and maintains the electrical contact between the second probe and the external terminal of the electronic device. In addition, of the contact force of the first probe against the inspection device, and the contact force of the second probe against the external terminal, the contact force due to fluid pressure in the cylinder is larger than the contact force due to the pressing force of the elastic member.

The meritorious effects of the present invention are summarized as follows.

The present invention has at least one of the advantages described below.

With the present invention, together with suppression of variation in the contact force between the probes and the electronic device and inspection device, the contact force can be maintained within a specified range, so the reliability of electrical testing can be improved, and a drop in yield due to poor connection can be suppressed.

PREFERRED MODES

Figure 1:
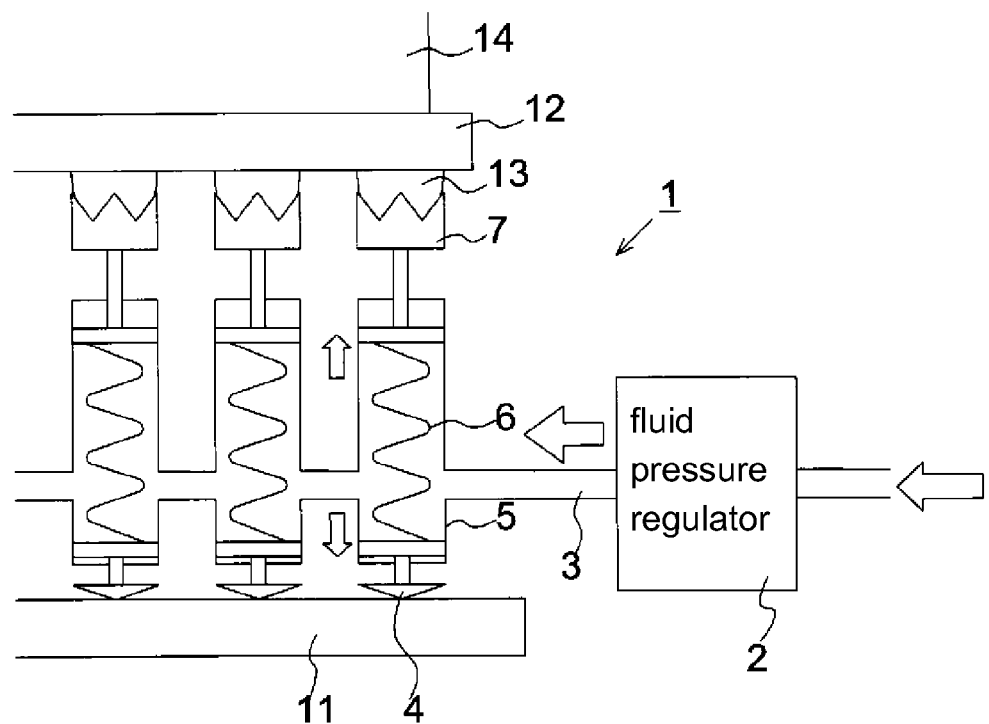
FIG. 1 is a schematic plan view of an electrical testing device of a first exemplary embodiment of the present invention.

An electrical testing device of a first exemplary embodiment of the present invention will be explained. FIG. 1 shows a schematic plan view of the electrical testing device of the first exemplary embodiment of the present invention.

An electrical testing device 1 is used in the testing of electrical characteristics of a test object 12 (for example, an electronic device), and electrically connects that test object 12 and an inspection device 11 (for example, a testing board). The electrical testing device 1 comprises a fluid pressure regulator 2, tubes 3, first probes 4, cylinders 5, elastic members 6 and second probes 7.

The first probe 4 and second probe 7 are electrically connected. When performing an electrical characteristics test, the first probes 4 are electrically connected to terminals of the inspection device 11, and the second probes 7 are electrically connected to external terminals 13 of the test object 12.

The cylinder 5 comprises the first probe 4, second probe 7, and the elastic member 6 that connects the first probe 4 and second probe 7. The tube 3 is connected to the cylinder 5 so that fluid can be allowed to flow into or out of the cylinder 5 between the first probe 4 and the second probe 7. In the embodiment shown in FIG. 1, the inside sections of a plurality of cylinders 5 are connected together by way of the tube 3. By doing so, it is possible to make the fluid pressure uniform in a plurality of cylinders 5.

The first probe 4 and second probe 7 are arranged such that they can move back and forth in the cylinder 5, and preferably, fit in the cylinder 5 so that the fluid supplied to the cylinder 5 can be held between the first probe 4 and the second probe 7. By doing so, the first probe 4 and second probe 7 can be moved back and forth in the cylinder 5 by the fluid pressure.

Moreover, the first probe 4 and second probe 7 are connected by way of the elastic member 6. The elastic member 6 preferably has a repulsive force that presses and moves the first probe 4 and second probe 7 in the respective outward directions, and, by doing so, is able to press the first probe 4 against the inspection device 11, and press the second probe 7 against the external terminal 13 of the test object 12. A coil spring, for example, can be used as the elastic member 6. The first probe 4 and second probe 7 can be electrically connected by the elastic member 6 by using an electrically conductive member as the elastic member 6, or can be electrically connected using a conductor that is separate from the elastic member 6.

A fluid flows into or out from between the first probe 4 and the second probe 7, with the force pressing in the respective outward directions being regulated by the fluid pressure. A gas or liquid can be used as the fluid, however, from the aspect of simplicity of use and cost, using air is preferred.

The fluid flows into the cylinder 5 through the tube 3. The fluid pressure in a plurality of cylinders 5 is controlled to a specified pressure by the fluid pressure regulator 2. When air, for example, is used as the fluid, an electrical fluid (air) regulator (electro-pneumatic regulator) can be used as the fluid regulator 2. The internal fluid pressure in a plurality of cylinders 5 can be controlled such that the internal pressures of the plurality of cylinders 5 become the same pressure by connecting the internal space of the cylinders 5 by the tube 3 as in the embodiment shown in FIG. 1, or the internal pressure of each cylinder 5 can be independently controlled by a fluid regulator.

The first probe 4 and the terminal of the inspection device 11, and the second probe 7 and the external terminal 13 of the test object 12 come in contact by way of the pressing force of the elastic member 6 and the fluid pressure in the cylinder 5. In other words, the contact force between the first probe 4 and the terminal of the inspection device 11, and the contact force between the second probe 7 and the external terminal 13 of the test object 12 are the combined force comprising the pressing force of the elastic member 6 and the fluid pressure in the cylinder 5. At this time, it is preferred that the contact force comprises mainly the fluid pressure in the cylinder 5 rather than the pressing force of the elastic member 6. It is preferred that variation in the contact force between each first probe 4 and each terminal of the inspection device 11 and the variation in the contact force between each second probe 7 and each external terminal 13 of the test object 12 be 5% or less, and more preferably, 1% or less. For example, it is presumed that the elastic member 6 is a coil spring, and that the variation in the pressing force thereof is ±20%. At this time, it is preferred that, of the contact force of the first probe 4 against the inspection device 11, and the contact force of the second probe 7 against the test object 12, the contact force due to the fluid pressure in the cylinder 5 be set to 5% or less. By doing so, variation in each contact force can be kept to 1% or less.

Next, an electrical testing method for an electronic device that uses the electrical testing device 1 shown in FIG. 1 will be explained. First, a handler pusher 14 supports the test object 12 and presses the test object 12 toward the inspection device 11. Next, the fluid pressure in the cylinder 5 is increased, and together with pressing the first probe 4 against the inspection device 11, presses the second probe 7 against the external terminal 13 of the test object 12. The fluid pressure regulator 2 maintains the fluid pressure in the plurality of cylinders 5 at a specified pressure. At this time, the contact force due to the fluid pressure is larger than the contact force due to the pressing force of the elastic member 6, so the contact force between each first probe 4 and the inspection device 11 and the contact force between each second probe 7 and each external terminal 13 of the test object 12 are maintained at a constant force. By doing so, insufficient or excessive contact force can be avoided, and the reliability of the electrical test of the test object 12 can be improved.

Figure 2:
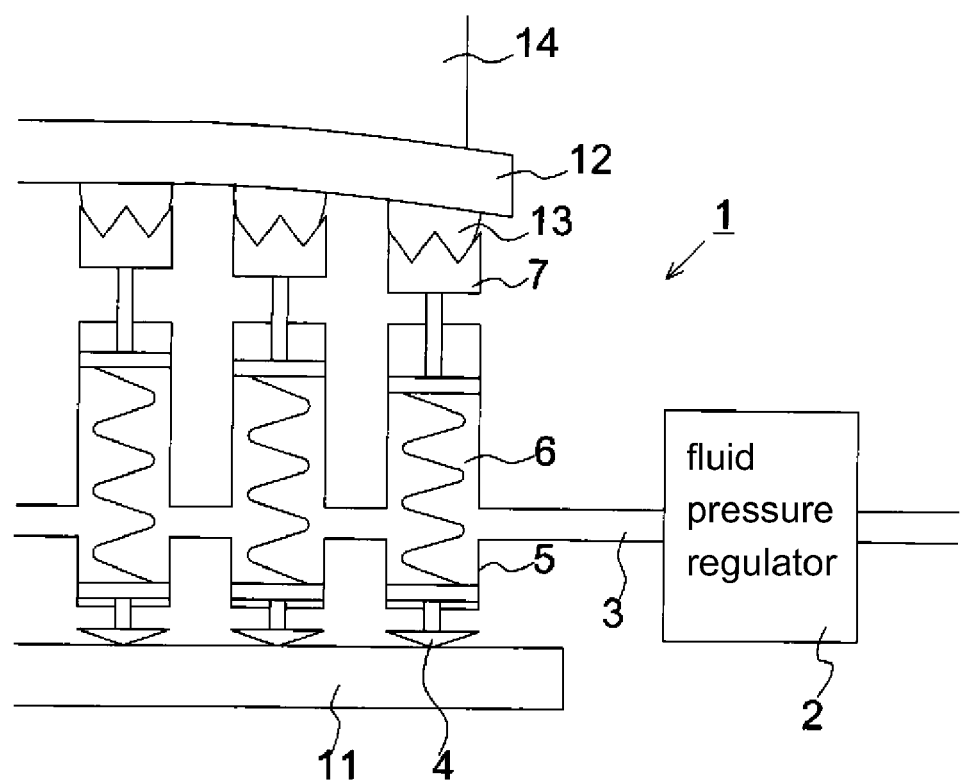
FIG. 2 is a schematic plan view of an electrical testing device of a first exemplary embodiment of the present invention.
Figure 3:
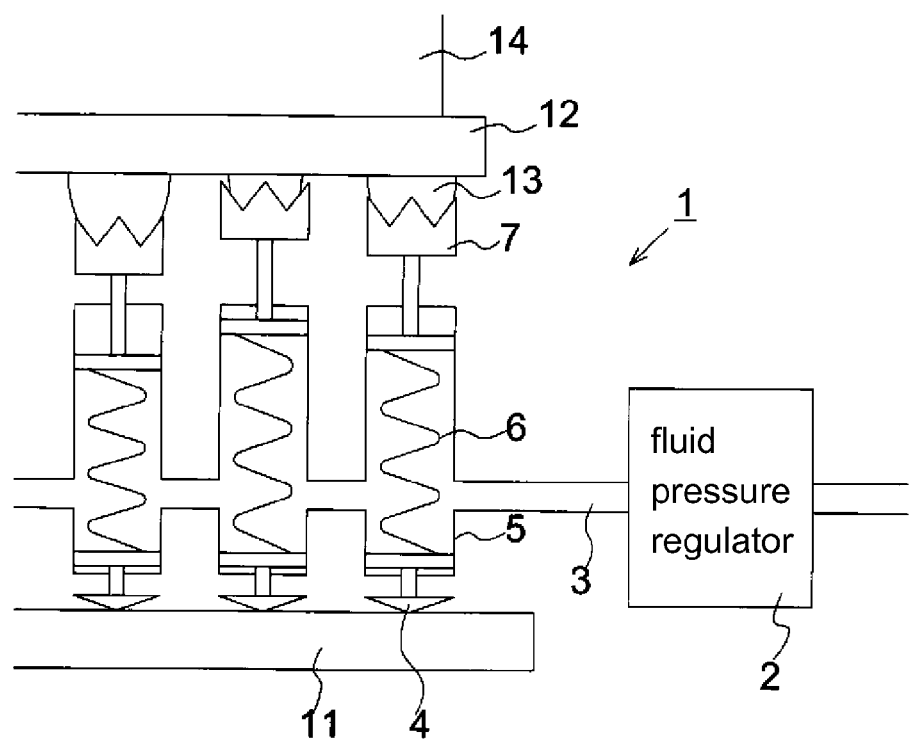
FIG. 3 is a schematic plan view of an electrical testing device of a first exemplary embodiment of the present invention.

FIG. 2 and FIG. 3 show schematic plan views of the electrical testing device of the first exemplary embodiment of the present invention. FIG. 2 shows the state in which the test object 12 deforms (warping occurs), and variation occurs in the position of the external terminal 13. With the present invention, even in this state, by controlling the fluid pressure that is applied to each probe such that it is constant, the contact force applied against each external terminal 13 can be kept constant. In addition, FIG. 3 shows the state in which variation occurs in the size of each external terminal 13. With the present invention, even in this state, by controlling the fluid pressure that is applied to each probe such that it is constant, the contact force applied against each external terminal 13 can be kept constant.

In FIG. 1 to FIG. 3, the external terminals 13 of the test object 12 are shown to be ball-shaped external terminals, however, they are not limited to this, and the present invention can be applied to various kinds of terminals such as flat-shaped terminals. Moreover, the shapes of the probes 4, 7 are not limited to the shapes shown in the figures, and can be suitably modified to correspond with the connecting object.

The electrical testing device and electrical testing method for an electronic device of the present invention are explained based on the exemplary embodiment described above, however, the invention is not limited to this embodiment, and needless to say the embodiment described above can include various changes, modifications and improvements that are within the scope of the present invention and that are based on the fundamental technical idea of the invention. Moreover, various combinations, substitutions or selections of the various disclosed elements are possible within the scope of the claims of the present invention.

Additional problems, objects and embodiments will become further evident from full disclosure of the present invention including the claims.

What is claimed is:

1. An electrical testing device, comprising:
    a first probe that comes in electrical contact with an inspection device;
    a second probe that is electrically connected to said first probe, and comes in electrical contact with an external terminal of a test object;
    a cylinder which houses said first probe and said second probe, and into or out of which fluid flows between said first probe and said second probe;
    an elastic member inside said cylinder that electrically connects said first probe to said second probe, said elastic member pushing said first probe toward said inspection device and said second probe toward said external terminal; and
    a fluid pressure regulator that controls fluid pressure in said cylinder;
    wherein a contact force between said first probe and said inspection device, and a contact force between said second probe and said external terminal are controlled by the fluid pressure in said cylinder.

2. The electrical testing device of claim 1, wherein the contact force of said first probe against said inspection device and the contact force of said second probe against said external terminal due to fluid pressure in said cylinder are larger than a contact force due to a pressing force of said elastic member.

3. The electrical testing device of claim 2, wherein the contact force due to a pressing force of said elastic member is 5% or less of the contact force due to said fluid pressure.

4. The electrical testing device of claim 1, wherein said elastic member is a coil spring.

5. The electrical testing device of claim 1, wherein said fluid comprises air, and said fluid pressure regulator comprises an electrical fluid regulator.

6. An electrical testing method for an electronic device comprising the steps of:
    supplying fluid into a cylinder that houses a first probe and second probe that are electrically connected;
    maintaining electrical contact between said first probe and an inspection device and maintaining electrical contact between said second probe and an external terminal of the electronic device by a fluid pressure in said cylinder;
    electrically connecting said first probe to said second probe with an elastic member inside said cylinder, said elastic member pushing said first probe outwardly into electrical contact with said inspection device and said second probe outwardly away from said first probe and into electrical contact with said external terminal; and
    controlling the fluid pressure in said cylinder.

7. The electrical testing method for an electronic device of claim 6, wherein
    the contact force of said first probe against said inspection device and the contact force of said second probe against said external terminal due to fluid pressure in said cylinder are larger than the contact force due to the pressing force of said elastic member.

8. An electrical testing device, comprising:
    a plurality of separate cylinders, each of said separate cylinders having a pair of opposing pistons therein that each sealably contacts an annular wall of the respective one of said separate cylinders, the two pistons of said pair of opposing pistons being electrically connected to each other with an elastic member that pushes the two pistons outwardly and apart from each other;
    a fluid supply conduit that supplies a fluid to each of said plurality of separate cylinders between the two pistons of the respective said pair of opposing pistons to push the two pistons outwardly and apart from each other;

each of said plurality of separate cylinders comprising a first probe that is urged outwardly by a respective one of said pair of opposing pistons into electrical contact with an inspection device and that is electrically connected to said respective one of said pair of opposing pistons, and a second probe that is urged outwardly by the other piston of said pair of opposing pistons into electrical contact with an external terminal of a test object and that is electrically connected to said other piston of said pair of opposing pistons; and a fluid pressure regulator that controls fluid pressure in said fluid supply conduit, thereby controlling, with said elastic member, an outward pressure of said first and second probes.

* * * * *